(12) United States Patent
Yoshida (10) Patent No.: US 11,041,118 B2
(45) Date of Patent: *Jun. 22, 2021

(54) FLUORIDE FLUORESCENT MATERIAL AND METHOD FOR PRODUCING THE SAME AS WELL AS LIGHT EMITTING DEVICE USING THE SAME

(71) Applicant: NICHIA CORPORATION, Anan (JP)

(72) Inventor: Tomokazu Yoshida, Anan (JP)

(73) Assignee: NICHIA CORPORATION, Anan (JP)

( * ) Notice: Subject to any disclaimer, the term of this patent is extended or adjusted under 35 U.S.C. 154(b) by 735 days.

This patent is subject to a terminal disclaimer.

(21) Appl. No.: 15/860,150

(22) Filed: Jan. 2, 2018

(65) Prior Publication Data

US 2018/0142142 A1    May 24, 2018

Related U.S. Application Data

(63) Continuation-in-part of application No. 15/482,965, filed on Apr. 10, 2017, now Pat. No. 10,030,196.
(Continued)

(30) Foreign Application Priority Data

Aug. 29, 2013 (JP) .................. 2013-177685

(51) Int. Cl.
   *C09K 11/02* (2006.01)
   *C09K 11/61* (2006.01)
   *C09K 11/67* (2006.01)

(52) U.S. Cl.
   CPC .......... *C09K 11/025* (2013.01); *C09K 11/675* (2013.01); *H01L 2224/48091* (2013.01);
(Continued)

(58) Field of Classification Search
   CPC ... C09K 11/025; C09K 11/616; C09K 11/617; C09K 11/665; C09K 11/675;
(Continued)

(56) References Cited

U.S. PATENT DOCUMENTS 8,057,706 B1    11/2011 Setlur et al.
8,679,871 B2    3/2014 Wakaki
(Continued)

FOREIGN PATENT DOCUMENTS

JP    2010135763 A    6/2010
JP    2011-012091 A    1/2011
(Continued)

OTHER PUBLICATIONS

Machine translation of JP2011012091 A, 56 pages. (Year: 2011).*
(Continued)

*Primary Examiner* — Matthew E. Hoban
*Assistant Examiner* — Lynne Edmondson
(74) *Attorney, Agent, or Firm* — Hunton Andrews Kurth LLP

(57) ABSTRACT

The present invention provides a method for producing a fluoride fluorescent material, comprising: contacting a fluoride particles represented by the following general formula (I):

$$K_2[M_{1-a}Mn^{4+}_aF_6] \quad (I)$$

wherein M is at least one member selected from the group consisting of elements belonging to Groups 4 and 14 of the Periodic Table, and a satisfies the relationship: $0 < a < 0.2$; with a solution containing alkaline earth metal ions in the presence of a reducing agent to form an alkaline earth metal fluoride and less than tetravalent manganese ions on the surface of the fluoride particles.

14 Claims, 3 Drawing Sheets

Related U.S. Application Data which is a continuation of application No. 14/469,816, filed on Aug. 27, 2014, now Pat. No. 9,650,563.

(52) U.S. Cl.
CPC .............. *H01L 2224/48247* (2013.01); *H01L 2224/48257* (2013.01); *H01L 2224/73265* (2013.01); *H01L 2924/00012* (2013.01); *H01L 2924/00014* (2013.01); *H01L 2924/181* (2013.01)

(58) Field of Classification Search
CPC .......... C09K 11/7792; C09K 2211/181; H01L 33/502; H01L 33/504; H05B 33/14
USPC ....... 252/301.4 R, 301.4 H; 313/503; 349/71
See application file for complete search history.

(56) References Cited

U.S. PATENT DOCUMENTS

| | | | |
|---|---|---|---|
| 9,650,563 B2 * | 5/2017 | Yoshida | ............... C09K 11/616 |
| 9,755,116 B2 * | 9/2017 | Akagawa | ............... C09K 11/617 |
| 10,030,196 B2 * | 7/2018 | Yoshida | ................... H01L 33/62 |
| 2006/0169998 A1 | 8/2006 | Radkov et al. | |
| 2008/0037252 A1 | 2/2008 | Nii et al. | |
| 2010/0112734 A1 | 5/2010 | Koizumi et al. | |
| 2011/0043101 A1 | 2/2011 | Masuda et al. | |
| 2012/0112623 A1 | 5/2012 | Kobashi | |
| 2012/0266942 A1 | 10/2012 | Komatsu et al. | |
| 2015/0048399 A1 | 2/2015 | Weiler et al. | |

FOREIGN PATENT DOCUMENTS

| | | | |
|---|---|---|---|
| JP | 2011012091 A | * | 1/2011 |
| JP | 2011054958 A | | 3/2011 |
| JP | 2011146480 A | | 7/2011 |
| JP | 2012069539 A | | 4/2012 |
| JP | 2012114416 A | | 6/2012 |
| JP | 2013533363 A | | 8/2013 |
| JP | 2013183042 A | | 9/2013 |
| WO | 2012-128837 A1 | | 9/2012 |

OTHER PUBLICATIONS

Non-Final Office Action for U.S. Appl. No. 14/657,676 dated Dec. 21, 2015.
Notice of Allowance for U.S. Appl. No. 14/657,676 dated May 26, 2016.
Machine translation of JP2011012091 A, printed Jun. 10, 2016.
Wikipedia, citation for visible light spectrum, (https://en.wikipedia.org/wiki/Visible_spectrum), printed Jun. 11, 2016, 6 pages.
Machine translation of JP2011012091 A, printed Jun. 23, 2017, 65 pages.
STIC partial translation of JP2011012091 A, 3 pages.
Non-Final Office Action for U.S. Appl. No. 15/482,965 dated Jun. 30, 2017, 11 pages.
Final Office Action for U.S. Appl. No. 15/482,965 dated Nov. 2, 2017, 10 pages.
Notice of Allowance for U.S. Appl. No. 15/482,965 dated Mar. 26, 2018, 8 pages.
Non-Final Office Action for U.S. Appl. No. 14/469,816 dated Jun. 29, 2016, 10 pages.
Final Office Action for U.S. Appl. No. 14/469,816 dated Nov. 3, 2016, 8 pages.
Notice of Allowance for U.S. Appl. No. 14/469,816 dated Jan. 11, 2017, 7 pages.
Non-Final Office Action for U.S. Appl. No. 15/207,003 dated Nov. 18, 2016, 10 pages.
Notice of Allowance for U.S. Appl. No. 15/207,003 dated Mar. 30, 2017, 7 pages.
Notice of Allowance for U.S. Appl. No. 15/207,003 dated May 15, 2017, 7 pages.

* cited by examiner

FLUORIDE FLUORESCENT MATERIAL AND METHOD FOR PRODUCING THE SAME AS WELL AS LIGHT EMITTING DEVICE USING THE SAME

CROSS-REFERENCE TO RELATED APPLICATIONS

This is a continuation-in-part of U.S. application Ser. No. 15/482,965 filed Apr. 10, 2017, which is a continuation of U.S. Ser. No. 14/469,816 filed Aug. 27, 2014, which claims priority under 35 USC 119 from Japanese patent Application No. 2013-177685, filed on Aug. 29, 2013, the entire disclosures of which are incorporated by reference herein.

BACKGROUND OF THE INVENTION

Field of the Invention

The present invention relates to a fluoride fluorescent material and a method for producing the same as well as a light emitting device using the same.

Description of the Related Art

A light emitting diode (LED) is a light emitting device frequently used as a substitute for a conventional light source, and is useful as a display lamp, a warning lamp, and a lamp for indicator or lighting. Like the light emitting diode, with respect to a laser diode (LD), various light emitting devices using a laser diode and a fluorescent material in combination have been proposed. Various types of light emitting devices emitting light of, e.g., white color, electric bulb color, or orange color have been developed, wherein the devices use a semiconductor light emitting element produced from a Group III-V alloy, such as gallium nitride (GaN), and a fluorescent material in combination. These light emitting devices emitting light of white color or the like is controlled in color tone by the principle of mixing colors of lights. As a system for emitting a white light, a system using a light emitting element emitting an ultraviolet light and three types of fluorescent materials respectively emitting red (R), green (G), and blue (B) lights, and a system using a light emitting element emitting a blue light and a fluorescent material emitting, e.g., a yellow light have been well known. A light emitting device of a system using a light emitting element emitting a blue light and a fluorescent material emitting, e.g., a yellow light is demanded in a wide variety of fields, such as a lighting, a car lighting, a display, and a backlight for liquid crystal. In these fields, the fluorescent material used in the display application is desired to have both excellent light emission efficiency and excellent intensity of color for reproducing colors in a wide range on the chromaticity coordinates. Further, the fluorescent material used in the display application is desired to be advantageously used in combination with a filter, and thus a fluorescent material exhibiting an emission spectrum having a narrow half band width is demanded.

For example, as a red light-emitting fluorescent material having an excitation band in the blue region, and exhibiting an emission spectrum having a narrow half band width, a fluoride fluorescent material having a composition, such as $K_2TiF_6:Mn^{4+}$, $Ba_2TiF_6:Mn^{4+}$, $Na_2TiF_6:Mn^{4+}$, or $K_3ZrF_7:Mn^{4+}$, has been known (see, for example, Japanese Patent Application prior-to-examination Publication (kohyo) No. 2009-528429). In addition, a fluoride fluorescent material having a composition: $K_2SiF_6:Mn^{4+}$ has been known (see, for example, Japanese Unexamined Patent Publication No. 2010-209311). Further, the excitation and emission spectra and the light emission mechanism of a fluoride complex fluorescent material activated by $Mn^{4+}$ have been known (see, for example, "Effective Mn(IV) Emission in Fluoride Coordination", written by A. G. Paulusz, J. Electrochemical Soc., 120 N7, 1973, p. 942-947).

SUMMARY OF THE INVENTION

A method for producing a fluoride fluorescent material, the method comprising: contacting fluoride particles represented by the following general formula (I):

$$K_2[M_{1-a}Mn^{4+}{}_aF_6] \quad (I)$$

wherein M is at least one member selected from the group consisting of elements belonging to Groups 4 and 14 of the Periodic Table, and a satisfies the relationship: $0<a<0.2$; with a solution containing alkaline earth metal ions in the presence of a reducing agent to form an alkaline earth metal fluoride and less than tetravalent manganese ions on the surface of the fluoride particles.

DETAILED DESCRIPTION OF THE INVENTION

The above-mentioned red light-emitting fluoride fluorescent materials activated by tetravalent manganese ions exhibiting an emission spectrum having a narrow half band width and light emitting devices using them are considered advantageous particularly to the application of backlight for liquid crystal, and desired to be brought into practical use. However, the conventional fluoride fluorescent materials activated by tetravalent manganese ions are not satisfactory in water resistance and thus have a problem about the long-term reliability.

In view of the above-mentioned problems accompanying the conventional techniques, the present invention has been made. It is a primary object of the present invention to provide a red light-emitting fluoride fluorescent material having excellent water resistance and a method for producing the same as well as a light emitting device using the same.

The present inventors have conducted extensive and intensive studies with a view toward solving the above-mentioned problems. As a result, the present invention has been completed. The present invention involves the following embodiments.

An embodiment is a fluoride fluorescent material comprising: fluoride particles represented by the following general formula (I):

$$K_2[M_{1-a}Mn^{4+}{}_aF_6] \quad (I)$$

wherein M is at least one element selected from the group consisting of elements belonging to Groups 4 and 14 of the Periodic Table, and a satisfies the relationship: $0<a<0.2$; an alkaline earth metal fluoride on the surface of the fluoride particles; and less than tetravalent manganese ions on the surface of the fluoride particles.

In another embodiment of the present invention, the alkaline earth metal fluoride comprises $CaF_2$.

Another embodiment of the present invention is a light emitting device comprising: a light source that generates light at 380 to 485 nm; and the fluoride fluorescent material according to claim 1.

In another embodiment of the present invention, light emitting device according to claim 3, further comprising a green fluorescent material that emits light at 495 to 573 nm when it absorbs light at 380 to 485 nm.

In another embodiment of the present invention, there can be provided a light source for a liquid crystal display apparatus, the light source comprising the light emitting device.

In another embodiment of the present invention, there can be provided an image display apparatus comprising the light emitting device.

In another embodiment of the present invention, the fluoride fluorescent material has an emission luminance maintain ratio, after a water resistance test, is 75% or more.

In another embodiment of the present invention, wherein the less than tetravalent manganese ions of the fluoride fluorescent material are bivalent manganese ions.

Another embodiment of the present invention, is a method for producing a fluoride fluorescent material, the method comprising contacting fluoride particles represented by the following general formula (I):

$$K_2[M_{1-a}Mn^{4+}{}_aF_6] \tag{I}$$

wherein M is at least one element selected from the group consisting of elements belonging to the Groups 4 and 14, and satisfies the relationship: 0<a<0.2; with a solution containing alkaline earth metal ions in the presence of a reducing agent to form an alkaline earth metal fluoride and less than tetravalent manganese ions on the surface of the fluoride particles.

In another embodiment of the present invention, the alkaline earth metal ions are calcium ions.

In another embodiment of the present invention, M is at least one element selected from the group consisting of titanium (Ti), zirconium (Zr), hafnium (Hf), silicon (Si), germanium (Ge), and tin (Sn).

In another embodiment of the present invention, the solution containing alkaline earth metal ions is a solution of at least one compound selected from the group consisting of a nitrate of alkaline earth metal, an acetate of alkaline earth metal, a chloride of alkaline earth metal, an iodide of alkaline earth metal, and a bromide of an alkaline earth metal.

In another embodiment of the present invention, the reducing agent is hydrogen peroxide.

In another embodiment of the present invention, the less than tetravalent manganese ions are bivalent manganese ions.

In the present specification, the term "step" means not only an independent step but also a step which cannot be clearly distinguished from the other steps but can achieve the desired object thereof. The range of values expressed using "to" indicates a range which includes the figures shown before and after "to" as, respectively, the minimum value and the maximum value. Further, with respect to the amount of a component contained in the composition, when a plurality of materials are present in the composition as the components of the composition, the amount of the components means the total amount of the materials present in the composition unless otherwise specified.

<Method for Producing a Fluoride Fluorescent Material>

The method for producing a fluoride fluorescent material of the present embodiment comprises: contacting fluoride particles represented by the general formula (I) below with a solution containing alkaline earth metal ions in the presence of a reducing agent to form an alkaline earth metal fluoride on the surface of the fluoride particles. In the formula (I), M is at least one member selected from the group consisting of elements belonging to Groups 4 and 14 of the Periodic Table, and a satisfies the relationship: 0<a<0.2.

$$K_2[M_{1-a}Mn^{4+}{}_aF_6] \tag{I}$$

The fluoride fluorescent material produced by the method of the present embodiment is a red light-emitting fluorescent material exhibiting an emission spectrum having a narrow half band width, and has excellent light emission properties, and can exhibit satisfactory durability in a long-term reliability test.

Generally, in the fluoride fluorescent material represented by the general formula (I), it is considered that tetravalent manganese ions constituting the fluoride fluorescent material react with water in the surface region of the particles to form manganese dioxide, so that the surface of the particles is colored black, lowering the luminance. For this reason, the fluoride fluorescent material cannot achieve satisfactory durability in a long-term reliability test, and has a problem in that it is difficult to apply the fluoride fluorescent material to the use which requires high reliability.

When the fluoride fluorescent material is placed in an aqueous solution containing alkaline earth metal ions, the fluoride particles suffer a dissolution reaction, so that ions of the metal constituting the fluoride particles and fluorine ions are formed. In this instance, the fluorine ions react with the alkaline earth metal ions to form an alkaline earth metal fluoride on the surface of the fluoride particles, making it possible to prevent the fluoride particles from further suffering a dissolution reaction. On the other hand, the tetravalent manganese ions are reduced to bivalent manganese ions due to the reducing agent present in the solution, so that the formation of manganese dioxide is suppressed.

Furthermore, when fluoride particles are added to an aqueous solution including a reducing agent, such as hydrogen peroxide, at least a portion of the reduced tetravalent manganese ions that are formed, including the bivalent manganese ions mentioned above, are deposited on the surface of the fluoride particles.

As mentioned above, in the fluoride fluorescent material produced by the method of the present embodiment, an alkaline earth metal fluoride is formed on the surface of the fluoride fluorescent material, and further the presence of the reducing agent suppresses the formation of manganese dioxide in the surface.

For these reasons, the fluoride fluorescent material is considered to have high light emission intensity and to be suppressed in a lowering of the luminance for a long term. Therefore, it is considered that the fluoride fluorescent material can achieve excellent long-term reliability.

In the present embodiment, in the fluoride fluorescent material represented by the general formula (I), M is at least one member selected from the group consisting of elements belonging to Groups 4 and 14 of the Periodic Table. It is preferred that M is at least one member selected from the group consisting of titanium (Ti), zirconium (Zr), hafnium (Hf), silicon (Si), germanium (Ge), and tin (Sn). It is further preferred that M comprises silicon (Si), or silicon (Si) and germanium (Ge).

With respect to a, there is no particular limitation as long as a satisfies the relationship: $0<a<0.2$, and a can be appropriately selected according to, e.g., intended light emission properties. a can be adjusted to a desired range by, for example, controlling the concentration of ions of the raw material compound in the below-mentioned method for producing fluoride particles.

The solution containing alkaline earth metal ions comprises at least alkaline earth metal ions, counter ions, and water. Examples of alkaline earth metal ions include magnesium (Mg) ions, calcium (Ca) ions, and strontium (Sr) ions.

Of these, from the viewpoint of achieving excellent emission luminance and water resistance, it is preferred that the alkaline earth metal ions comprise calcium ions.

The solution containing alkaline earth metal ions is obtained in the form of an aqueous solution of a compound comprising an alkaline earth metal, and may contain another component (e.g., an alcohol, such as methanol or ethanol) if necessary. Examples of compounds comprising an alkaline earth metal include alkaline earth metal nitrates {e.g., $Mg(NO_3)_2$, $Ca(NO_3)_2$, and $Sr(NO_3)_2$}, alkaline earth metal acetates {e.g., $Mg(CH_3CO_2)_2$, $Ca(CH_3CO_2)_2$, and $Sr(CH_3CO_2)_2$}, alkaline earth metal chlorides {e.g., $MgCl_2$, $CaCl_2$, and $SrCl_2$}, alkaline earth metal iodides {e.g., $MgI_2$, $CaI_2$, and $SrI_2$}, and alkaline earth metal bromides {e.g., $MgBr_2$, $CaBr_2$, and $SrBr_2$}.

With respect to the compound comprising an alkaline earth metal, a single type may be used, or two or more types may be used in combination.

With respect to the concentration of the alkaline earth metal in the solution containing alkaline earth metal ions, there is no particular limitation. The lower limit of the alkaline earth metal concentration of the solution containing alkaline earth metal ions is, for example, 0.01% by weight or more, preferably 0.03% by weight or more, more preferably 0.05% by weight or more. Further, the upper limit of the alkaline earth metal concentration of the solution containing alkaline earth metal ions is, for example, 5% by weight or less, preferably 3% by weight or less, more preferably 2% by weight or less.

In the present embodiment, the amount of the solution containing alkaline earth metal ions is, relative to 100 parts by weight of the fluoride particles, preferably 100 to 3,000 parts by weight, more preferably 200 to 2,000 parts by weight. When the solution containing alkaline earth metal ions in such an amount is used, the water resistance is further improved.

At least part of tetravalent manganese ions caused due to a reaction between the fluoride particles and the solution containing alkaline earth metal ions are reduced to bivalent manganese ions by the presence of a reducing agent. Specifically, by adding a reducing agent, 90 mol % or more of tetravalent manganese ions caused due to a reaction between the fluoride particles and the solution containing alkaline earth metal ions are preferably reduced, more preferably, 95 mol % or more of the tetravalent manganese ions are reduced. Following this reduction, at least a portion of the bivalent manganese ions are permanently deposited on the surface of the fluoride particles.

With respect to the reducing agent, there is no particular limitation as long as it can reduce tetravalent manganese ions. Specific examples of reducing agents include hydrogen peroxide and oxalic acid. Of these, preferred is hydrogen peroxide because hydrogen peroxide can reduce manganese without adversely affecting the base of the fluoride particles, for example, without dissolving the entirety of the fluoride particles, and hydrogen peroxide is finally decomposed into harmless water and oxygen, and hence can be easily used in the production process and causes less load on the environment.

In the embodiment of the present invention where hydrogen peroxide is used as the reducing agent, at least a portion of the fluoride particles dissolve into the solution and manganese ions having a valence of less than four, such as divalent manganese ions, are formed. The manganese ions are formed according to the following reaction:

$$H_2MnF_6 + H_2O_2 \rightarrow MnF_2 + 4HF + O_2$$

The less than tetravalent manganese ions resulting from the above reaction may react with, for example, fluoride ions to form largely unsoluble manganese fluoride ($MnF_2$). At least a portion of the manganese fluoride will be permanently deposited on the surface of the fluoride particles.

With respect to the amount of the reducing agent added, there is no particular limitation. The amount of the reducing agent added can be appropriately selected according to, for example, the content of the manganese in the fluoride particles, but a preferred amount of the reducing agent added is such that the base of the fluoride particles is not adversely affected. The amount of the reducing agent added is, specifically, preferably 1 equivalent % or more, more preferably 3 equivalent % or more, based on the amount of the manganese contained in the fluoride particles.

1 Equivalent means mole(s) of the reducing agent required to reduce 1 mole of tetravalent manganese ions to bivalent manganese ions.

The lower limit of the reducing agent concentration of the solution containing alkaline earth metal ions is, for example, 0.01% by weight or more, preferably 0.03% by weight or more, more preferably 0.05% by weight or more. Further, the upper limit of the reducing agent concentration of the solution containing alkaline earth metal ions is, for example, 5% by weight or less, preferably 3% by weight or less, more preferably 2% by weight or less.

(Contacting Method)

With respect to the method for contacting the fluoride particles with the solution containing alkaline earth metal ions in the presence of a reducing agent, there is no particular limitation, as long as at least a portion of the reduced tetravalent manganese ions are permanently deposited on the surface of the fluoride particles. As an example of the contacting method, there can be mentioned a method in which the reducing agent, the fluoride particles, and the solution containing alkaline earth metal ions are mixed with each other.

(Contacting Time)

With respect to the time during which the fluoride particles and the solution containing alkaline earth metal ions are contacted in the presence of a reducing agent, there is no particular limitation as long as an alkaline earth metal fluoride can be formed on the surface of the fluoride particles and as long as a portion of the reduced tetravalent manganese ions are permanently deposited on the surface of the fluoride particles. The contacting time can be, for example, 10 minutes to 10 hours, preferably 30 minutes to 5 hours.

(Reaction Temperature)

With respect to the temperature at which the reducing agent, the fluoride particles, and the solution containing alkaline earth metal ions are mixed with each other, there is no particular limitation. For example, they can be mixed at a temperature in the range of from 15 to 40° C., preferably at a temperature in the range of from 23 to 28° C.

Further, with respect to the atmosphere for the mixing, there is no particular limitation. The mixing may be performed in general air or in an atmosphere of an inert gas, such as nitrogen gas.

[Other Steps]

The method for producing a fluoride fluorescent material may further comprise another step if necessary. For example, the fluoride fluorescent material obtained by the method of the present embodiment can be recovered by solid-liquid separation, such as filtration. The obtained fluoride fluorescent material may be washed with a solvent, such as ethanol, isopropyl alcohol, water, or acetone. Further, the obtained fluoride fluorescent material may be subjected to drying treatment. In such a case, the obtained fluoride fluorescent material is dried at, for example, 50° C. or higher, preferably 55° C. or higher, more preferably 60° C. or higher, and at, for example, 110° C. or lower, preferably 100° C. or lower, more preferably 90° C. or lower. With respect to the time for drying, there is no particular limitation as long as the moisture attached to the fluoride fluorescent material can be evaporated, and the drying time is, for example, about 10 hours.

In the fluorescent material particles in the present embodiment, the fluoride particles forming a fluorescent material and alkaline earth metal ions are reacted to form an alkaline earth metal fluoride on the surface of the fluoride particles. Thus, the probability of crystals, which are soluble in water, present on the surface of the fluoride particles is reduced, so that even when the surface of the fluoride particles is dissolved out in, e.g., moisture, the formation of manganese dioxide is suppressed to prevent the surface from being colored black, making it possible to suppress a lowering of the light emission intensity. In the present embodiment, the alkaline earth metal fluoride is preferably formed in the form of a film on the surface of the fluoride particles. When the alkaline earth metal fluoride is present in the form of a film on the surface of the fluoride particles, while suppressing the dissolution of the surface in, e.g., moisture, the light extraction efficiency can be improved. Thus, a fluorescent material having high luminance and excellent water resistance is obtained.

Further, it is preferred that the alkaline earth metal fluoride is calcium fluoride.

[Method for Producing Fluoride Particles]

The method of the present embodiment may further comprise the step of obtaining fluoride particles.

In the present embodiment, the fluoride particles are obtained by, for example, a method comprising the step of contacting, in a liquid medium comprising hydrogen fluoride, first complex ions comprising tetravalent manganese ions, potassium ions, and second complex ions comprising at least one member selected from the group consisting of elements belonging to Groups 4 and 14 of the Periodic Table with one another to obtain fluoride particles represented by the general formula (I).

With respect to the method for contacting the first complex ions, potassium ions, and the second complex ions with one another, there is no particular limitation. For example, there can be mentioned a method in which a first solution containing the first complex ions, a second solution containing potassium ions, and a third solution containing the second complex ions are mixed with each other. In this case, hydrogen fluoride may be contained in any of the first to third solutions, or the first to third solutions may be mixed in a liquid medium comprising hydrogen fluoride.

From the viewpoint of achieving excellent formation efficiency of the fluoride particles and excellent light emission properties, the method for producing the fluoride particles preferably comprises mixing together a first solution containing the first complex ions, a second solution containing potassium ions, and a third solution containing the second complex ions, more preferably comprises mixing together a first solution containing the first complex ions and hydrogen fluoride, a second solution containing potassium ions and hydrogen fluoride, and a third solution containing the second complex ions.

(First Solution)

The first solution (hereinafter, also referred to as "solution A") contains at least the first complex ions comprising tetravalent manganese ions, and may contain another component if necessary. It is preferred that the first solution further contains hydrogen fluoride in addition to the first complex ions.

The first solution is obtained in the form of, for example, an aqueous solution of hydrofluoric acid containing a tetravalent manganese ion source. With respect to the manganese source, there is no particular limitation as long as it is a compound containing tetravalent manganese ions. Specific examples of manganese sources which can constitute the first solution include $K_2MnF_6$, $KMnO_4$, and $K_2MnCl_6$. Of these, preferred is $K_2MnF_6$ because, for example, $K_2MnF_6$ does not contain chlorine which is likely to strain the crystal lattice to cause the crystal to be unstable, and $K_2MnF_6$ can be stably present as $MnF_6$ complex ions in hydrofluoric acid while maintaining the oxidation number (tetravalent) which can achieve activation. Among the manganese sources, one containing potassium can serve also as a potassium source contained in the second solution.

With respect to the manganese source constituting the first solution, a single type may be used, or two or more types may be used in combination.

With respect to the concentration of the first complex ions in the first solution, there is no particular limitation. The lower limit of the first complex ion concentration of the first solution is, for example, 0.1% by weight or more, preferably 0.3% by weight or more, more preferably 0.5% by weight or more. Further, the upper limit of the first complex ion concentration of the first solution is, for example, 5% by weight or less, preferably 3% by weight or less, more preferably 2% by weight or less. The first complex ion concentration can be determined by making a calculation from the amounts of the components charged upon preparing the first solution. The concentration of each component in the solution shown below is similarly determined.

When the first solution contains hydrogen fluoride, the lower limit of the hydrogen fluoride concentration of the first solution is, for example, 30% by weight or more, preferably 35% by weight or more, more preferably 40% by weight or more. Further, the upper limit of the hydrogen fluoride concentration of the first solution is, for example, 70% by weight or less, preferably 65% by weight or less, more preferably 60% by weight or less. When the hydrogen fluoride concentration is 30% by weight or more, the manganese source (for example, $K_2MnF_6$) constituting the first solution is improved in the stability to hydrolysis, so that a change of the tetravalent manganese ion concentration of the first solution is suppressed. Thus, it is likely that the amount of the manganese for activation contained in the obtained fluoride particles can be easily controlled, making it possible to suppress variation (change) of the light emission efficiency of the fluoride particles. On the other hand, when the hydrogen fluoride concentration is 70% by weight or less, a lowering of the boiling point of the first solution is suppressed, so that the generation of hydrogen fluoride gas is suppressed. Thus, the hydrogen fluoride concentration of the first solution can be easily controlled, making it possible to effectively suppress variation (change) of the particle diameter of the obtained fluoride particles.

The first solution may, in addition to the first complex ions, further contain the second complex ions comprising at least one member selected from the group consisting of elements belonging to Groups 4 and 14 of the Periodic Table. The second complex ions and preferred modes thereof are described in detail below.

When the first solution contains the second complex ions in addition to the first complex ions, the lower limit of the second complex ion concentration of the first solution is not particularly limited, and may be, for example, 1% by weight or more. The upper limit of the second complex ion concentration of the first solution is, for example, 30% by weight or less, preferably 25% by weight or less, more preferably 20% by weight or less.

(Second Solution)

The second solution (hereinafter, also referred to as "solution B") contains at least potassium ions, and may contain another component if necessary. It is preferred that the second solution further contains hydrogen fluoride in addition to potassium ions.

The second solution is obtained in the form of, for example, an aqueous solution of hydrofluoric acid containing potassium ions. Specific examples of potassium sources containing potassium ions which can constitute the second solution include water-soluble potassium salts, such as KF, $KHF_2$, KOH, KCl, KBr, KI, $CH_3CO_2K$, and $K_2CO_3$. Of these, preferred is $KHF_2$ because $KHF_2$ can be dissolved without lowering the hydrogen fluoride concentration of the solution, and further has small heat of dissolution and hence achieves high safety.

With respect to the potassium source constituting the second solution, a single type may be used, or two or more types may be used in combination.

The lower limit of the potassium ion concentration of the second solution is, for example, 10% by weight or more, preferably 12.5% by weight or more, more preferably 15% by weight or more. Further, the upper limit of the potassium ion concentration of the second solution is, for example, 35% by weight or less, preferably 32.5% by weight or less, more preferably 30% by weight or less. When the potassium ion concentration is 10% by weight or more, it is likely that the yield of the fluoride fluorescent material is improved. On the other hand, when the potassium ion concentration is 35% by weight or less, it is likely that the obtained fluoride particles have an increased particle diameter.

When the second solution contains hydrogen fluoride, the lower limit of the hydrogen fluoride concentration of the second solution is, for example, 30% by weight or more, preferably 35% by weight or more, more preferably 40% by weight or more. Further, the upper limit of the hydrogen fluoride concentration of the second solution is, for example, 70% by weight or less, preferably 65% by weight or less, more preferably 60% by weight or less.

(Third Solution)

The third solution (hereinafter, also referred to as "solution C") contains at least the second complex ions comprising at least one member selected from the group consisting of elements belonging to Groups 4 and 14 of the Periodic Table, and may contain another component if necessary. It is preferred that the second complex ions further comprise fluorine ions in addition to the at least one member selected from the group consisting of elements belonging to Groups 4 and 14 of the Periodic Table.

The third solution is obtained in the form of, for example, an aqueous solution containing the second complex ions.

The second complex ions preferably comprise at least one member selected from the group consisting of titanium (Ti), zirconium (Zr), hafnium (Hf), silicon (Si), germanium (Ge), and tin (Sn), more preferably comprise silicon (Si), or silicon (Si) and germanium (Ge), further preferably are silicon fluoride complex ions.

For example, when the second complex ions comprise silicon (Si), the second complex ion source is preferably a compound containing silicon and fluoride ions and having excellent solubility in the solution. Specific examples of second complex ion sources include $H_2SiF_6$, $Na_2SiF_6$, $(NH_4)_2SiF_6$, $Rb_2SiF_6$, and $Cs_2SiF_6$. Of these, $H_2SiF_6$ is preferred because $H_2SiF_6$ has high solubility in water and contains no alkali metal element as an impurity.

With respect to the second complex ion source constituting the third solution, a single type may be used, or two or more types may be used in combination.

The lower limit of the second complex ion concentration of the third solution is, for example, 10% by weight or more, preferably 15% by weight or more, more preferably 20% by weight or more. Further, the upper limit of the second complex ion concentration of the third solution is, for example, 60% by weight or less, preferably 55% by weight or less, more preferably 50% by weight or less.

With respect to the method for mixing the first solution, second solution, and third solution, there is no particular limitation, and, while stirring the first solution, the second solution and third solution may be added to the first solution, while stirring the third solution, the first solution and second solution may be added to the third solution, or, while stirring the second solution, the first solution and third solution may be added to the second solution. Alternatively, the first solution, second solution, and third solution may be individually placed in a vessel and mixed with each other by stirring.

Of these, from the viewpoint of efficiently obtaining the fluoride particles, the method for mixing the first solution, second solution, and third solution is preferably a method in which, while stirring the first solution, the second solution and third solution are added to the first solution.

Mixing means for mixing the first solution, second solution, and third solution can be appropriately selected from mixing means generally used according to, e.g., the reaction vessel.

With respect to the temperature at which the first solution, second solution, and third solution are mixed together, there is no particular limitation. For example, the solutions can be mixed together at a temperature in the range of from 15 to 40° C., preferably at a temperature in the range of from 23 to 28° C.

Further, with respect to the atmosphere for the mixing, there is no particular limitation. The mixing may be performed in general air or in an atmosphere of an inert gas, such as nitrogen gas.

<Fluoride Fluorescent Material>

The fluoride fluorescent material of the present embodiment comprises fluoride particles represented by the general formula (I) above, and an alkaline earth metal fluoride on the surface of the fluoride particles.

The fluoride fluorescent material of the present embodiment is preferably produced by the method for producing a fluoride fluorescent material of the present embodiment. The fluoride fluorescent material comprises the fluoride particles represented by the general formula (I) above as a fluorescent core, and a surface region in which an alkaline earth metal fluoride is present. In the present embodiment, an alkaline earth metal fluoride is present in the surface region, and therefore the concentration of tetravalent manganese ions in the surface region having an alkaline earth metal fluoride present therein is lower than the concentration of tetravalent manganese ions in the fluoride particles.

The fluoride fluorescent material of the present embodiment has excellent water resistance, and is excited by a light having a wavelength of a visible light on the short wavelength side to emit light in the red range. Further, the fluoride fluorescent material exhibiting an emission spectrum having a narrow half band width is realized.

Figure 1:
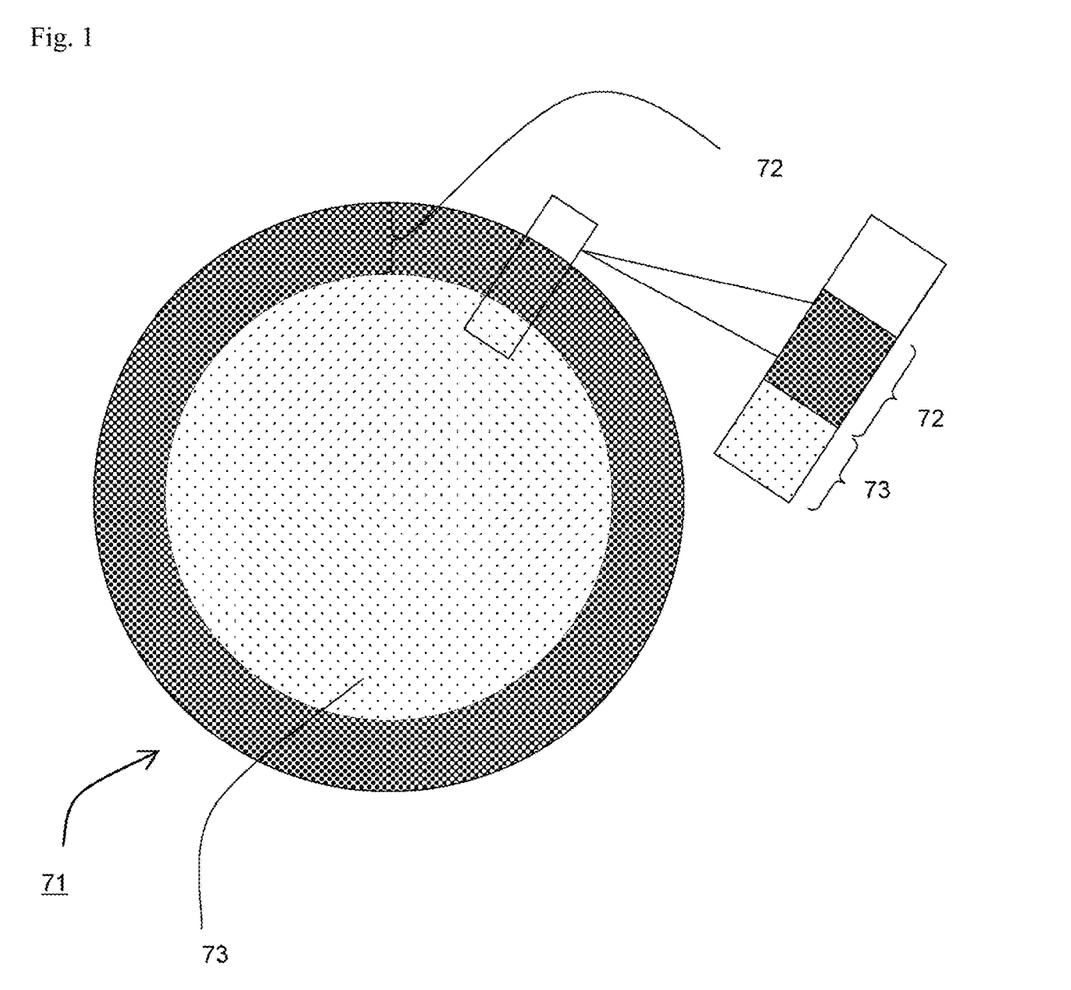
FIG. 1 is a view diagrammatically showing the fluoride fluorescent material of the present embodiment.
Figure 2:
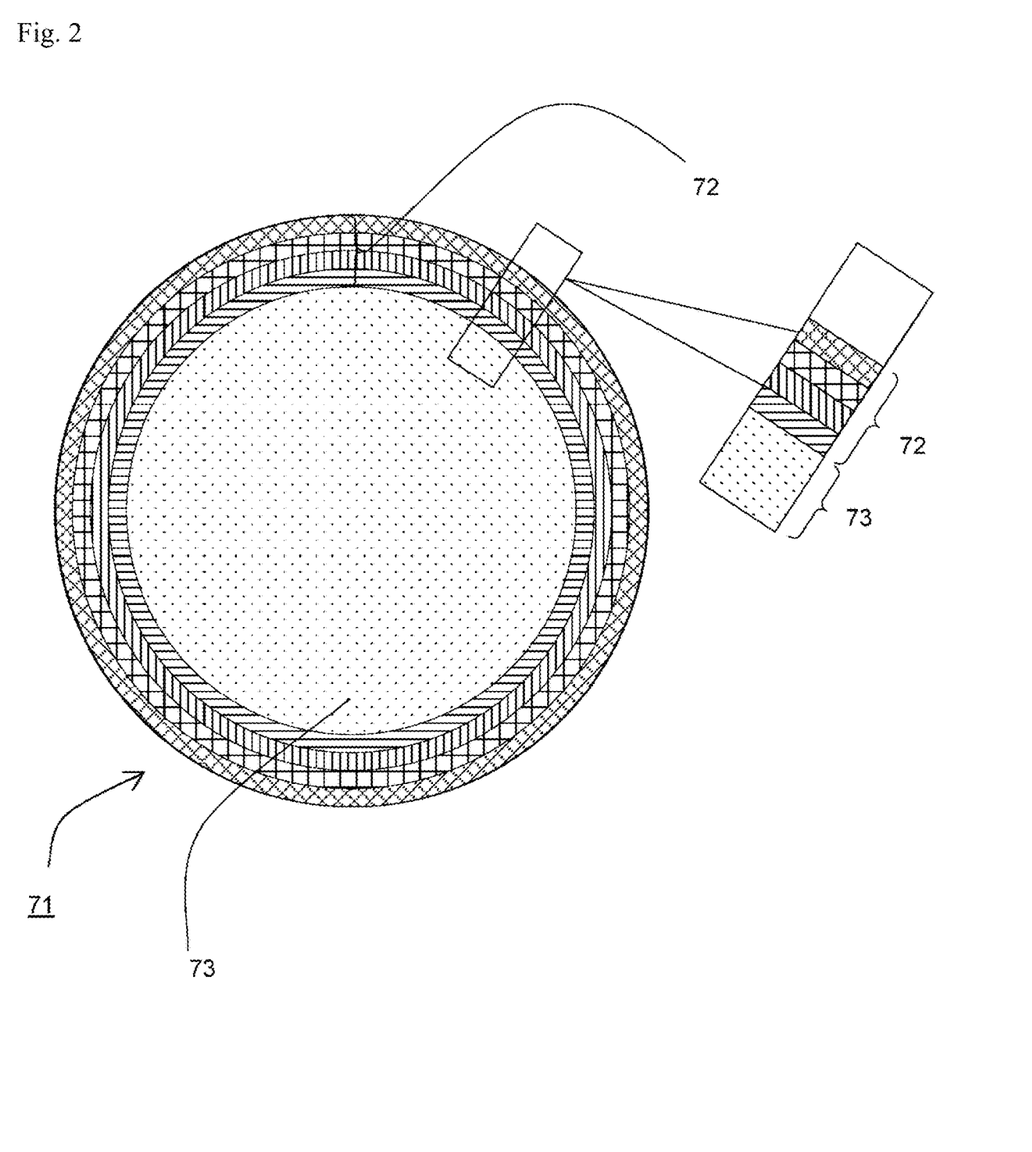
FIG. 2 is a view diagrammatically showing the fluoride fluorescent material of the present embodiment.

Hereinbelow, an example of the fluoride fluorescent material according to an embodiment of the present invention is described with reference to the drawings. FIGS. 1 and 2 are individually drawings showing an example of the fluoride fluorescent material of the present embodiment and an enlarged view thereof. Fluoride fluorescent material 71 has fluoride particle 73, and surface region 72 having an alkaline earth metal fluoride. Surface region 72 of the fluoride fluorescent material may be either of a single layer in which, as shown in FIG. 1, the alkaline earth metal fluoride is uniformly present, or of a multilayer structure in which, as shown in FIG. 2, the alkaline earth metal fluoride concentration is increased in the direction of from the inside of surface region 72 (i.e., the fluoride particle 73 side) to the outside. Further, the surface region may have a mode in which a plurality of layers having a specific alkaline earth metal fluoride concentration are not defined by definite interfaces in surface region 72 and the alkaline earth metal fluoride concentration is gradually increased in the direction of from the inside to the outside of surface region 72.

In the present embodiment, from the viewpoint of achieving excellent emission luminance and water resistance, it is preferred that the alkaline earth metal fluoride comprises $CaF_2$. Further, in the present embodiment, it is more preferred that the surface region is a layer of the alkaline earth metal fluoride.

In the fluoride fluorescent material obtained by the above-mentioned method, the whole of the particles are a fluoride fluorescent material activated by tetravalent manganese ions, which maintains properties of a color reproduction range wider than that obtained using a conventional fluoride fluorescent material, and the alkaline earth metal fluoride present on the surface of the fluoride fluorescent material can reduce the probability of manganese present on the surface. Therefore, even when the surface of the fluoride fluorescent material particles is dissolved out in moisture, no or less tetravalent manganese ions are present in the surface region, and hence the formation of manganese dioxide derived from tetravalent manganese ions is suppressed. Thus, the surface of the fluoride fluorescent material particles is prevented from being colored black, making it possible to suppress a lowering of the light emission intensity.

In the present embodiment, the lower limit of the alkaline earth metal fluoride concentration of the fluoride fluorescent material is, for example, 0.05% by weight or more, preferably 0.1% by weight or more, more preferably 0.2% by weight or more. The upper limit of the concentration of the alkaline earth metal fluoride present in the surface region is, for example, 5% by weight or less, preferably 3% by weight or less, more preferably 1% by weight or less. When the alkaline earth metal fluoride concentration is in the above range, the tetravalent manganese ion concentration can be reduced to approximately zero, improving the water resistance.

By virtue of having the above-mentioned construction of the fluoride fluorescent material, when the fluoride fluorescent material is in contact with water, a lowering of the emission luminance caused by coloring due to the formation of manganese dioxide derived from tetravalent manganese ions can be suppressed, realizing the fluoride fluorescent material having high water resistance.

The water resistance of the fluoride fluorescent material can be evaluated by, for example, an emission luminance maintaining ratio after the water resistance test, i.e., a ratio (%) of the emission luminance after the water resistance test to the emission luminance before the water resistance test. The emission luminance maintaining ratio after the water resistance test is preferably 75% or more, more preferably 80% or more, further preferably 85% or more.

The water resistance test is conducted, specifically, by immersing the fluoride fluorescent material in water having a weight 1 to 5 times (preferably 3 times) the weight of the fluorescent material, and stirring the resultant water at 25° C. for one hour.

<Light Emitting Device>

The light emitting device of the present embodiment comprises a light source that generates light in the wavelength range of from 380 to 485 nm, and the fluoride fluorescent material. The light emitting device may further comprise another constituent member if necessary. The light emitting device is not particularly limited, and can be appropriately selected from conventionally known light emitting devices. Examples of the light emitting devices include lighting apparatuses, such as a fluorescent lamp, display apparatuses, such as a display and a radar, and a light source for a liquid crystal display apparatus.

By virtue of having the fluoride fluorescent material, the light emitting device can achieve excellent long-term reliability.

(Light Source)

As a light source (hereinafter, also referred to as "excitation light source"), a light source that generates light in the wavelength range of from 380 to 485 nm, which is the short wavelength region of a visible light, is used. The light source preferably has an emission peak wavelength in the wavelength range of from 420 to 485 nm, more preferably in the wavelength range of from 440 to 480 nm. By using such a light source, the fluoride fluorescent material can be efficiently excited, and thus a visible light can be effectively utilized. Further, by using an excitation light source having the above-mentioned wavelength range, a light emitting device having high light emission intensity can be provided.

It is preferred that, as the excitation light source, a semiconductor light emitting element (hereinafter, also referred to simply as "light emitting element") is used. By using a semiconductor light emitting element as the excitation light source, there can be obtained a light emitting device which has high efficiency and high linearity of the output with respect to the input and which is resistant to a mechanical impact and stable.

With respect to the light emitting element, one that generates light having a wavelength of a visible light on the short wavelength side can be used. For example, as a blue or green light emitting element, one using a nitride semiconductor ($In_XAl_YGa_{1-X-Y}N$, $0 \leq X$, $0 \leq Y$, $X+Y \leq 1$) can be used.

(Fluoride Fluorescent Material)

The details of the fluoride fluorescent material in the light emitting device are as mentioned above. The fluoride fluorescent material can constitute the light emitting device by, for example, being contained in an encapsulation resin covering the excitation light source. In the light emitting device having the excitation light source covered by an encapsulation resin containing the fluoride fluorescent material, part of the light emitted from the excitation light source is absorbed by the fluoride fluorescent material and emitted as a red light. By using the excitation light source that generates light in the wavelength range of from 380 to 485 nm, the emitted light can be more effectively utilized. Thus, a loss of the light emitted from the light emitting device can be reduced, so that the light emitting device having high efficiency can be provided.

With respect to the amount of the fluoride fluorescent material contained in the light emitting device, there is no particular limitation, and the amount of the fluoride fluorescent material can be appropriately selected according to, e.g., the excitation light source.

(Another Fluorescent Material)

It is further preferred that the light emitting device further comprises, in addition to the fluoride fluorescent material, another fluorescent material. Another fluorescent material may be any fluorescent material which absorbs light from the light source and changes the light in wavelength to light having a different wavelength. Another fluorescent material can constitute the light emitting device like the fluoride fluorescent material by, for example, being contained in an encapsulation resin.

Another fluorescent material is preferably at least one member selected from the group consisting of, for example, nitride fluorescent materials, oxide nitride fluorescent materials, and sialon fluorescent materials, each activated mainly by a lanthanoid element, such as Eu or Ce; alkaline earth halogen apatite fluorescent materials, alkaline earth metal halogen borate fluorescent materials, alkaline earth metal aluminate fluorescent materials, alkaline earth silicates, alkaline earth sulfides, alkaline earth thiogallates, alkaline earth silicon nitrides, and germanates, each activated mainly by a lanthanoid element, such as Eu, or a transition metal element, such as Mn; rare earth aluminates and rare earth silicates, each activated mainly by a lanthanoid element, such as Ce; and inorganic and organic complexes each activated mainly by a lanthanoid element, such as Eu.

Specific examples of other fluorescent materials include $(Ca, Sr, Ba)_2SiO_4:Eu$, $(Y, Gd)_3(Ga, Al)_5O_{12}:Ce$, $(Si, Al)_6(O, N)_8:Eu(\beta\text{-sialon})$, $SrGa_2S_4:Eu$, $(Ca, Sr)_2Si_5N_8:Eu$, $CaAlSiN_3:Eu$, $(Ca, Sr)AlSiN_3:Eu$, $Lu_3Al_5O_{12}:Ce$, and $(Ca, Sr, Ba, Zn)_8MgSi_4O_{16}(F, Cl, Br, I):Eu$.

By using another fluorescent material in the light emitting device, the light emitting device having various color tones can be provided.

When the light emitting device further comprises another fluorescent material, the amount of the fluorescent material contained is not particularly limited, and may be appropriately selected so as to obtain desired light emission properties.

When the light emitting device further comprises another fluorescent material, the light emitting device preferably comprises a green fluorescent material, more preferably a green fluorescent material that emits light in the wavelength range of from 495 to 573 nm when it absorbs light in the wavelength range of from 380 to 485 nm. The light emitting device comprising a green fluorescent material can be more preferably applied to a liquid crystal display apparatus.

With respect to the form of the light emitting device, there is no particular limitation, and the form can be appropriately selected from forms generally used. As examples of forms of the light emitting device, there can be mentioned a shell type and a surface mount type. Generally, the shell type indicates a light emitting device having a resin which constitutes the outer surface and which is formed into a shell shape. The surface mount type indicates a light emitting device having a container portion in a depressed form filled with a light emitting element as a light source and a resin. As a further example of the form of the light emitting device, there can be mentioned a light emitting device in which a light emitting element as a light source is mounted on a printed circuit board in a flat plate form, and an encapsulation resin containing the fluoride fluorescent material is formed in a lens shape so as to cover the light emitting element.

Figure 3:
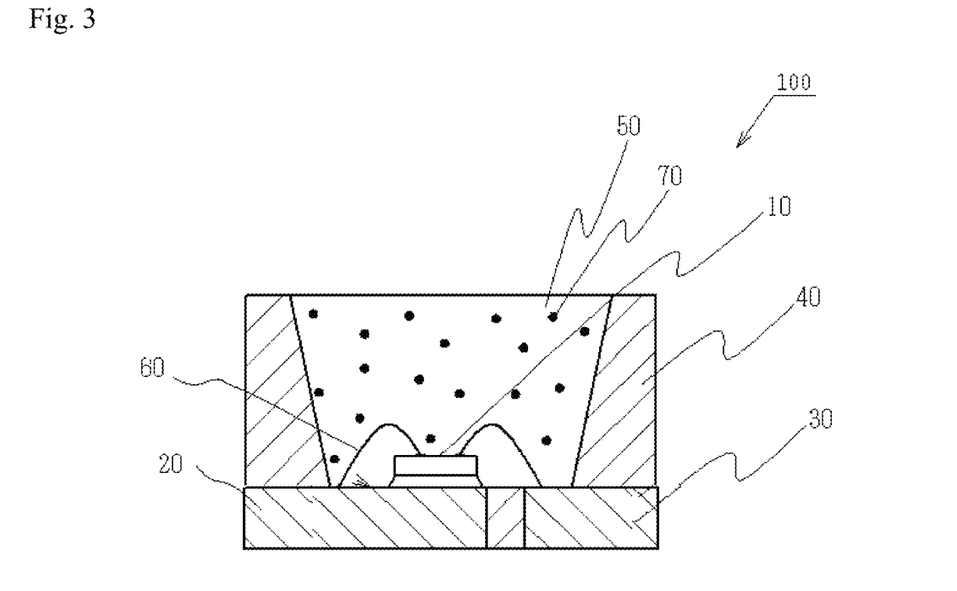
FIG. 3 is a diagrammatic cross-sectional view showing the light emitting device of the present embodiment.
Figure 4:
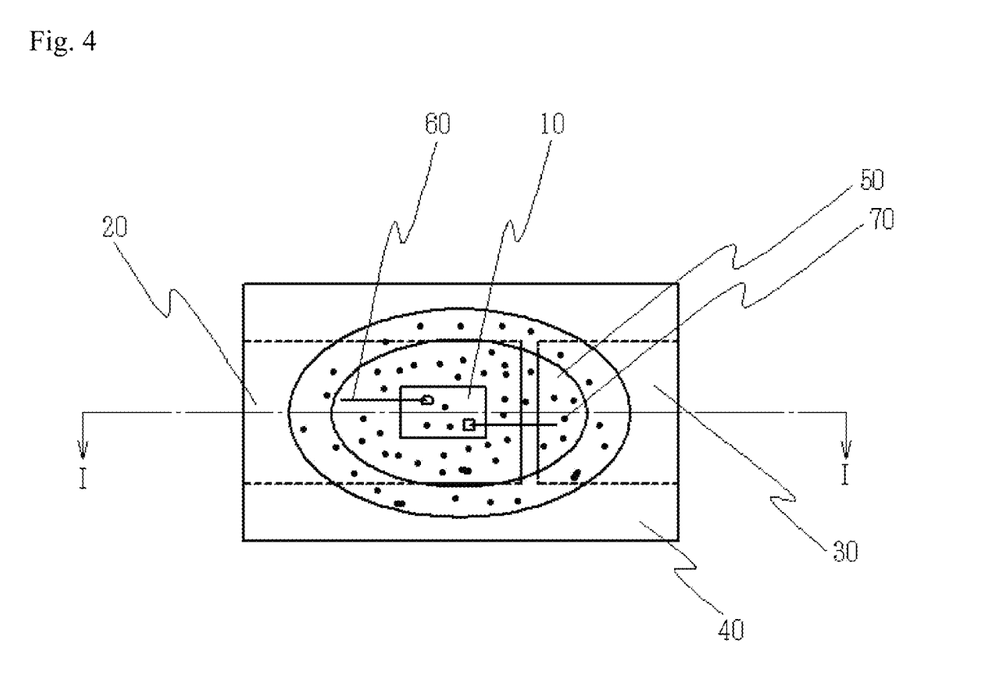
FIG. 4 is a diagrammatic plan view showing the light emitting device of the present embodiment.

Hereinbelow, an example of the light emitting device according to the present embodiment will be described with reference to the drawings. FIG. 3 is a diagrammatic cross-sectional view showing an example of the light emitting device of the present embodiment. FIG. 4 is a diagrammatic plan view showing an example of the light emitting device of the present embodiment. This light emitting device is an example of a surface mount-type light emitting device.

Light emitting device 100 has light emitting element 10 comprised of a gallium nitride compound semiconductor that generates light having a wavelength of a visible light on the short wavelength side (for example, 380 to 485 nm), and molded piece 40 which has placed thereon light emitting element 10. Molded piece 40 has first lead 20 and second lead 30, and they are integrally molded using a thermoplastic resin or thermosetting resin. Molded piece 40 has formed a depressed portion having a bottom and sides, and has light emitting element 10 placed on the bottom of the depressed portion. Light emitting element 10 has a pair of positive and negative electrodes, and a pair of the positive and negative electrodes is electrically connected to first lead 20 and second lead 30 through wire 60. Light emitting element 10 is encapsulated by encapsulation member 50. As encapsulation member 50, a thermosetting resin, such as an epoxy resin, a silicone resin, an epoxy-modified silicone resin, or a modified silicone resin, is preferably used. Encapsulation member 50 contains fluoride fluorescent material 70 which changes the wavelength of light from light emitting element 10.

<Image Display Apparatus>

The image display apparatus comprises the at least one light emitting device. With respect to the image display apparatus, there is no particular limitation as long as the apparatus comprises the light emitting device, and the apparatus can be appropriately selected from conventionally known image display apparatuses. The image display apparatus has, for example, in addition to the light emitting device, a color filter member and a light transmission control member.

By virtue of having the light emitting device, the image display apparatus exhibits excellent luminance and color reproduction range as well as excellent long-term reliability.

EXAMPLES

Hereinbelow, the present invention will be described in more detail with reference to the following Examples, which should not be construed as limiting the scope of the present invention.

Comparative Example 1

The method for preparing fluoride particles in Comparative Example 1 constituting a fluorescent core is first described below. 16.25 g of $K_2MnF_6$ was weighed and dissolved in 1,000 g of a 55% by weight aqueous HF solution to prepare solution A, so that the charged composition became as shown in Table 1. Separately, 195.10 g of $KHF_2$ was weighed and dissolved in 200 g of a 55% by weight aqueous HF solution to prepare solution B. Further, 450 g of a 40% by weight aqueous $H_2SiF_6$ solution was weighed and prepared as solution C. While stirring solution A, solution B and solution C were simultaneously added to solution A, and the resultant deposits were separated, and then washed with IPA (isopropyl alcohol), and dried at 70° C. for 10 hours to prepare fluoride particles in Comparative Example 1 constituting a fluorescent core.

Example 1

1.18 g of calcium nitrate tetrahydrate was weighed and dissolved in DIW (deionized water) to prepare 200 g of an aqueous solution containing calcium ions in an amount of 0.1% by weight, so that the conditions for charged reaction solution became as shown in Table 2. Then, 6.9 g of a 30% aqueous $H_2O_2$ solution was added as a reducing agent to the prepared aqueous solution, and then 20 g of the fluoride particles prepared in Comparative Example 1 were added thereto, and the resultant mixture was stirred at 25° C. for one hour to effect a reaction, forming calcium fluoride on the surface of the fluoride particles. The resultant deposits were separated, and then washed with IPA, and dried at 70° C. for 10 hours to prepare a fluoride fluorescent material in Example 1.

Examples 2 to 4

Fluoride fluorescent materials in Examples 2 to 4 were individually prepared by substantially the same method as the method for the fluoride fluorescent material in Example 1 except that the conditions for charged reaction solution, the amount of the fluoride particles used, and the reaction conditions were changed to those shown in Table 2.

Example 5

2.11 g of magnesium nitrate hexahydrate was weighed and dissolved in DIW to prepare 200 g of an aqueous solution containing magnesium ions in an amount of 0.1% by weight, so that the conditions for charged reaction solution became as shown in Table 2. Then, 6.9 g of a 30% aqueous $H_2O_2$ solution was added as a reducing agent to the prepared aqueous solution, and then 20 g of the fluoride particles prepared in Comparative Example 1 was added thereto, and the resultant mixture was stirred at 25° C. for one hour to effect a reaction, forming magnesium fluoride on the surface of the fluoride particles. The resultant deposits were separated, and then washed with IPA, and dried at 70° C. for 10 hours to prepare a fluoride fluorescent material in Example 5.

Example 6

A fluoride fluorescent material in Example 6 was prepared by substantially the same method as in Example 5 except that the conditions for charged reaction solution, the amount of the fluoride particles used, and the reaction conditions were changed to those shown in Table 2.

TABLE 1

| | Charged composition (mol) | | | | Solution A Charged amount (g) | | Solution B Charged amount (g) | | Solution C Charged amount (g) |
|---|---|---|---|---|---|---|---|---|---|
| | K | Si | Mn | F | $K_2MnF_6$ | 55% Aqueous HF solution | $KHF_2$ | 55% Aqueous HF solution | 40% Aqueous $H_2SiF_6$ solution |
| Comparative example 1 | 2 | 0.95 | 0.05 | 6 | 16.25 | 1000 | 195.10 | 200 | 450 |

TABLE 2

| | Conditions for charged reaction solution | | | Fluoride particles Fluorescent material in Comparative Example 1 (g) | Reaction conditions | |
|---|---|---|---|---|---|---|
| | Alkaline earth metal ion type | Ion concentration (wt %) | Reducing agent concentration (wt %) | | Reaction solution amount (g) | Reaction time (hr) |
| Example 1 | $Ca^{2+}$ | 0.1 | 1 | 20 | 200 | 1 |
| Example 2 | $Ca^{2+}$ | 0.1 | 1 | 20 | 400 | 1 |
| Example 3 | $Ca^{2+}$ | 0.1 | 1 | 20 | 200 | 4 |
| Example 4 | $Ca^{2+}$ | 0.5 | 1 | 20 | 200 | 1 |
| Example 5 | $Mg^{2+}$ | 0.1 | 1 | 20 | 200 | 1 |
| Example 6 | $Mg^{2+}$ | 0.5 | 1 | 20 | 200 | 1 |

(Evaluation of Emission Luminance Characteristics)

With respect to the above-obtained fluoride fluorescent materials in Examples 1 to 6 and Comparative Example 1, prior to a water resistance test, general measurement of the emission luminance characteristics was conducted. The relative emission luminances determined when the emission luminance in Comparative Example 1 measured before a water resistance test is taken as 100.0% are as shown in Table 3 below. The emission luminance characteristics were measured under conditions at an excitation wavelength of 460 nm for a reflective luminance.

(Water Resistance Test)

With respect to the above-obtained fluoride fluorescent materials in Examples 1 to 6 and Comparative Example 1, a water resistance was evaluated. A water resistance test was conducted in which 5 g of the fluorescent material was immersed in 15 g of pure water and stirred at 25° C. for one hour and then, the resultant material was separated and washed with IPA, and dried at 70° C. for 10 hours. Thus, the fluoride fluorescent materials after the water resistance test were individually obtained.

With respect to the fluoride fluorescent materials after the water resistance test, measurement of the emission luminance characteristics was performed in the same manner as mentioned above. The results are shown in Table 3. A ratio of the relative luminance after the water resistance test to the relative luminance before the water resistance test is also shown as a luminance maintaining ratio (%).

TABLE 3

|  | Emission luminance characteristics | | | Emission luminance characteristics after water resistance test | | | Luminance maintaining ratio (%) |
|---|---|---|---|---|---|---|---|
|  | Chromaticity coordinates | | Relative luminance | Chromaticity coordinates | | Relative luminance | |
|  | x | y | (%) | x | y | (%) | |
| Comparative example 1 | 0.677 | 0.313 | 100.0 | 0.677 | 0.313 | 72.4 | 72.4 |
| Example 1 | 0.677 | 0.312 | 104.7 | 0.677 | 0.313 | 96.8 | 92.5 |
| Example 2 | 0.677 | 0.313 | 104.7 | 0.677 | 0.312 | 95.1 | 90.8 |
| Example 3 | 0.677 | 0.313 | 105.7 | 0.677 | 0.312 | 98.0 | 92.8 |
| Example 4 | 0.677 | 0.312 | 105.9 | 0.677 | 0.312 | 96.8 | 91.4 |
| Example 5 | 0.679 | 0.312 | 103.0 | 0.678 | 0.312 | 81.3 | 78.9 |
| Example 6 | 0.679 | 0.312 | 103.9 | 0.678 | 0.312 | 82.5 | 79.4 |

As apparent from Table 3, in Examples 1 to 6, the luminance is improved. The reason for this is presumed that an alkaline earth metal fluoride having a refractive index different from that of the fluorescent material was formed on the surface of the fluorescent material particles, so that the light extraction efficiency was improved.

As also apparent from Table 3, the fluoride fluorescent material having no alkaline earth metal fluoride in Comparative Example 1 had an emission luminance lowered to 72.4%. By contrast, the fluoride fluorescent materials in all the Examples achieved a luminance maintaining ratio of 75% or more. Especially, the fluoride fluorescent materials in Examples 1 to 4, in which the alkaline earth metal ions are calcium ions, achieved a luminance maintaining ratio of 90% or more, which has confirmed the utility of the present Examples.

INDUSTRIAL APPLICABILITY

The fluoride fluorescent material of the present invention and the light emitting device using the same can be used in, for example, a fluorescent character display tube, a display, a PDP, a CRT, an FL, an FED, and a projector tube, particularly, in a backlight light source using a blue light emitting diode as a light source and having extremely excellent light emission properties, an LED display, a light source for white lighting, a signal, a light switch, and various types of sensors and indicators, and especially in the use of display, they exhibit excellent light emission properties.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

The invention claimed is:

1. A fluoride fluorescent material comprising:
fluoride particles represented by the following general formula (I):

$$K_2[M_{1-a}Mn^{4+}{}_aF_6] \quad (I)$$

wherein M is at least one element selected from the group consisting of elements belonging to Groups 4 and 14 of the Periodic Table, and a satisfies: 0<a<0.2;
an alkaline earth metal fluoride on a surface of the fluoride particles; and
less than tetravalent manganese ions on the surface of the fluoride particles.

2. The fluoride fluorescent material according to claim 1, wherein the alkaline earth metal fluoride comprises $CaF_2$.

3. A light emitting device comprising:
a light source that generates light at 380 to 485 nm; and
the fluoride fluorescent material according to claim 1.

4. The light emitting device according to claim 3, further comprising a green fluorescent material that emits light at 495 to 573 nm when it absorbs light at 380 to 485 nm.

5. A light source for a liquid crystal display apparatus, the light source comprising the light emitting device according to claim 3.

6. An image display apparatus comprising the light emitting device according to claim 3.

7. The fluoride fluorescent material according to claim 1, wherein an emission luminance maintain ratio, after a water resistance test, is 75% or more.

8. The fluoride fluorescent material according to claim 1, wherein the less than tetravalent manganese ions are bivalent manganese ions.

9. A method for producing a fluoride fluorescent material, the method comprising:

contacting fluoride particles represented by the following general formula (I):

$$K_2[M_{1-a}Mn^{4+}{}_aF_6] \quad (I)$$

wherein M is at least one element selected from the group consisting of elements belonging to the Groups 4 and 14, and satisfies: 0<a<0.2;

with a solution containing alkaline earth metal ions in the presence of a reducing agent to form an alkaline earth metal fluoride and less than tetravalent manganese ions on a surface of the fluoride particles.

10. The method according to claim 9, wherein the alkaline earth metal ions are calcium ions.

11. The method according to claim 9, wherein M is at least one element selected from the group consisting of titanium (Ti), zirconium (Zr), hafnium (Hf), silicon (Si), germanium (Ge), and tin (Sn).

12. The method according to claim 9, wherein the solution containing alkaline earth metal ions is a solution of at least one compound selected from the group consisting of a nitrate of an alkaline earth metal, an acetate of an alkaline earth metal, a chloride of an alkaline earth metal, an iodide of an alkaline earth metal, and a bromide of an alkaline earth metal.

13. The method according to claim 9, wherein the reducing agent is hydrogen peroxide.

14. The method according to claim 9, wherein the less than tetravalent manganese ions are bivalent manganese ions.

* * * * *